RADIO VOLUME AND TONE CONTROLS USING FIELD EFFECT TRANSISTORS

Filed Dec. 22, 1967

INVENTOR.
Paul W. Wood
BY Thomas N. Young
ATTORNEY

United States Patent Office 3,544,901

Patented Dec. 1, 1970

3,544,901

RADIO VOLUME AND TONE CONTROLS USING FIELD EFFECT TRANSISTORS

Paul W. Wood, Warren, Mich., assignor to General Motors Corporation, Detroit, Mich., a corporation of Delaware Filed Dec. 22, 1967, Ser. No. 692,891
Int. Cl. H04b *1/16*
U.S. Cl. 325—397 4 Claims

ABSTRACT OF THE DISCLOSURE

Volume and tone control circuits for radio receivers. Each circuit employs a field effect transistor connected to operate as a variable gain amplifier by applying a selectively variable positive DC voltage to the drain electrodes of the transistors.

This invention relates to radio receivers and particularly to improved volume and tone control apparatus therefor.

Conventionally, a radio receiver is equipped with means for varying a characteristic, such as volume or tone, of the audio output. This is accomplished by varying a characteristic such as amplitude or frequency content of the signal transmitted between the detector stage and the audio amplifier stage. To effect such variation, mechanically operated devices such as rheostats and variable reactance filters are electrically connected between the detector and audio amplifier stages. These devices can be remotely located from the receiver only by way of flexible cable connections.

In accordance with the present invention, radio receiver audio characteristics such as volume and tone may be varied by means of a variable gain amplifier electrically connected to vary a characteristic of the signal transmitted from the detector to the audio amplifier stages of the receiver. Moreover, the variable gain amplifier may be regulated by a remotely-located manually operable control device which is electrically rather than mechanically linked to the receiver. Accordingly, great latitude is afforded in the respective locations of radio receivers and manual control devices within automobiles and other areas of application.

In a preferred embodiment, field effect transistors may be employed as variable gain amplifiers by connecting the gate electrode to receive the detector output and connecting the drain electrode to a source of variable DC voltage. This drain electrode connection carries no radio signal and thus need not be shielded under ordinary circumstances. As the following description more specifically relates, volume and tone control is effected by connecting the field effect transistors between the detector and audio amplifier stages of the receiver, the volume connection being serial in nature and the tone control connection being of the shunt type.

These and other advantages of the invention may be best understood by referring to the following description of specific embodiments together with the accompanying drawings of which:

Figure 1:
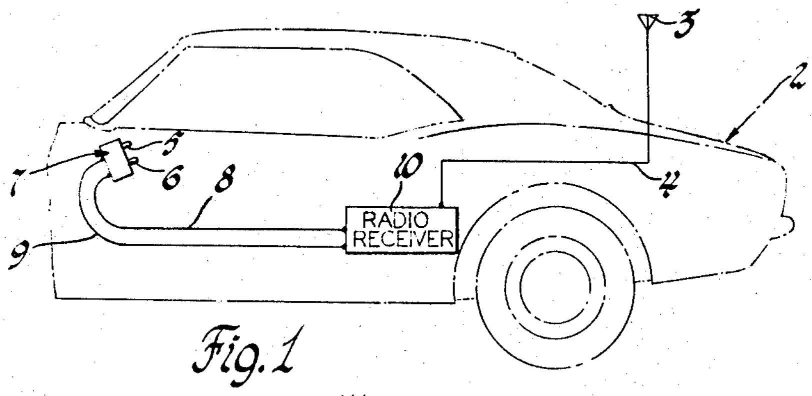
FIG. 1 shows an automobile radio arrangement embodying the invention.

The following specification describes a specific embodiment of the invention whicn is particularly adapted for automobile radio receivers. Referring to FIG. 1, a conventional automobile 2 is equipped with an antenna 3 to pick up standard AM or FM radio broadcasts. Antenna 3 is connected to a radio receiver 10 which is located under the rear seat of the automobile by way of a lead 4. Volume and tone control knobs 5 and 6, respectively, are mounted on a rheostat box 7 and interconnected with the receiver 10 by single wire conductors 8 and 9. This arrangement is merely illustrative of the remote relation between receiver 10 and control knobs 5 and 6 permitted by the invention. It is this particular freedom of location and ease of interconnection which particularly qualifies the embodiment for automotive use, but it is to be understood that the invention is not limited to use in automobiles.

Figure 2:
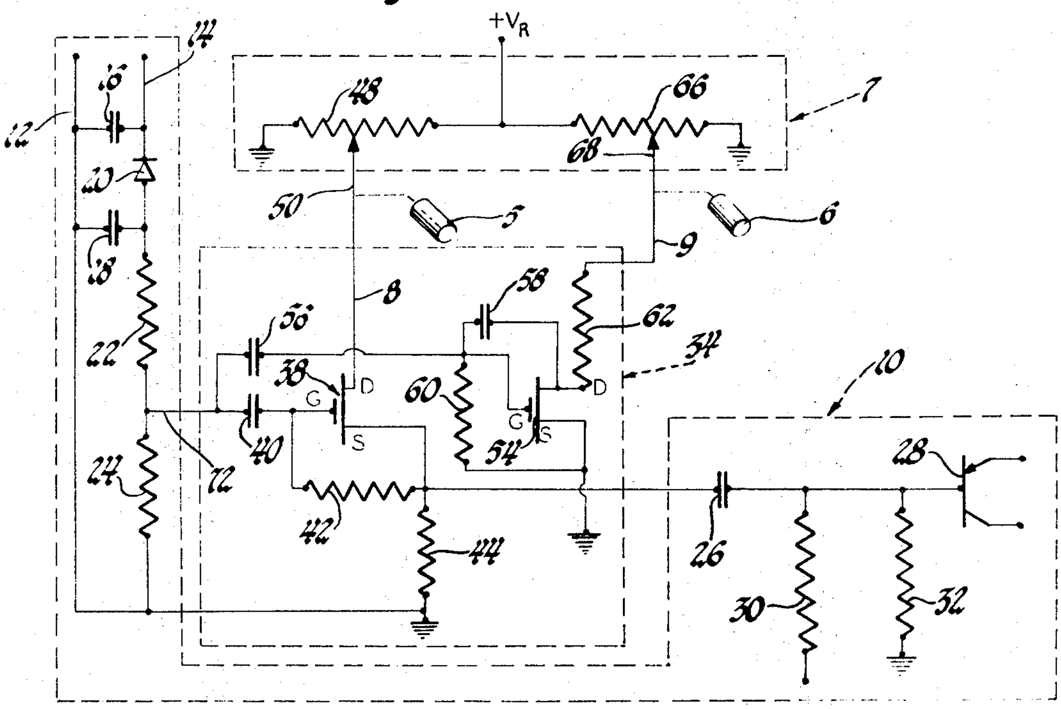
FIG. 2 is a schematic diagram of a portion of the radio receiver and controls embodying the invention.

Referring to FIG. 2, reference character 10 again identifies the radio receiver of which only the portion following the last IF transformer is shown in schematic detail. The upper left-hand portion of the drawing shows a pair of conductors 12 and 14 which, if full details of the receiver circuit were shown, would be connected across the secondary winding of the last intermediate frequency transformer. Conductors 12 and 14 transmit the received radio signal to a detector stage comprising capacitors 16 and 18 connected across the conductors 12 and 14. The detector circuit further includes a diode 20 or its equivalent connected in conductor 14 between one plate of each of the capacitors 16 and 18. Conductor 14 feeds into a filter resistor 22 and an audio signal resistor 24 across which the audio signal is developed. The audio signal developed across resistor 24 is subject to both volume and tone control by way of apparatus to be described and then presented to an audio amplifier stage transistor 28 by means of a coupling capacitor 26 and a pair of shunt connected resistors 30 and 32.

The volume and tone control circuits are identified by reference character 34 and FIG. 2. These circuits include field effect transistors which are connected to operate as variable gain amplifiers. These amplifiers are subject to control by a manually-operable control unit identified in both FIGS. 1 and 2 by reference character 7.

More specifically, the volume control circuit includes a field effect transistor 38 having gate source and drain electrodes identified by the letters G, S, and D, respectively. The audio signal developed across resistor 24 is coupled to the gate electrode of transistor 38 by means of a capacitor 40. A resistor 42 connects the gate and source electrodes of transistor 38. The source electrode is also connected across a large shunt resistor 44 to ground. The source electrode, which represents the output electrode of transistor 38, is also connected through the coupling capacitor 26 to the audio amplifier section previously described. The drain electrode of transistor 38 is connected to an unshielded single wire conductor 8 which carries a variable amplitude positive polarity DC voltage generated by means of a volume rheostat in control section 7. This rheostat includes a linearly distributed resistor 48 and a wiper 50 which is mechanically connected to control knob 5 to be manually displaceable across resistor 48. The right-hand side of resistor 48 as seen in FIG. 2 is connected to a positive voltage source identified as $+V_R$, and the left-hand end of resistor 48 is grounded. The source $V_R$ may, of course, be an automobile battery.

Figure 3:
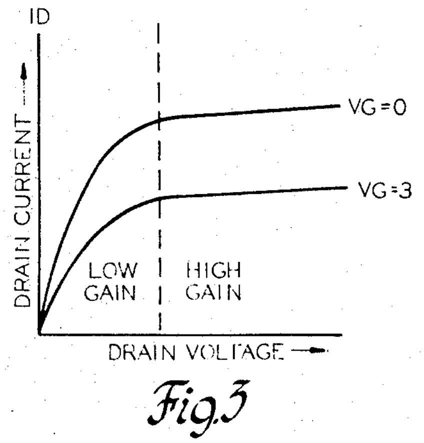
FIG. 3 is a plot of drain current against drain voltage at various gate voltages for a field effect transistor.

Reference to FIG. 3 shows a family of curves, each plotted at a constant gate voltage, showing the change in drain current which results from a change in drain voltage. The curves indicate a low gain area to the left of the knee of the curve which, as well known to those skilled in the art, is known as the pinch-off voltage of a field effect transistor. Similarly, the high-gain region is indicated to the right of the pinch-off voltage point. The curves thus suggest that the overall gain of the field effect transistor amplifier may be controlled by controlling the positive DC voltage applied to the drain electrode.

Referring back to FIG. 2, manually moving the wiper 50 to the extreme right-hand side of resistor 48 applies a maximum positive voltage to the drain electrode of transistor 38. This results in maximum gain and therefore maximum audio signal transfer from the audio resistor 24 to the audio stage identified by transistor 28. Accordingly, maximum volume exists in this condition. By moving wiper 50 to the left or toward the ground end, the drain voltage applied to transistor 38 is decreased, thus decreasing the gain of the transistor 38 and correspondingly decreasing the volume. At the minimum volume position of wiper 50 on resistor 48, a by-pass path for the audio signal is provided through resistor 42, resulting in some signal transfer even under minimum volume conditions. It is apparent that the arrangement of transistor 38 with resistors 42 and 44 causes the combination to function as a source follower amplifier.

In FIG. 2, the tone control portion of the receiver circuit is shown to include a second field effect transistor 54, also having gate source and drain electrodes identified by the letters G, S and D. The tone control elements, like the volume control, are connected into the receiver 10 between the detector resistor 24 and the audio amplifier 28. The signal from resistor 24 is coupled into the gate of transistor 54 by means of capacitor 56. A capacitor 58 is connected between the drain and gate electrodes of transistor 54 to cause that transistor to exhibit the well-known Miller feedback effect. As will be apparent to those skilled in the art, the Miller feedback presents a multiplied variable capacitance effect which, in combination with a fixed resistor 60, is effective to selectively modify by filtering action the frequency content in the audio signal presented to the audio amplifier section. The resistor 60 is connected between the gate and source electrodes of transistor 54, of which the source electrode is grounded, as shown. To accomplish the variable capacitance effect, the gain of the amplifier including transistor 54 is controlled by varying the drain voltage in accordance with the previous discussion given with reference to FIG. 3. The drain electrode is connected through a resistor 62 and a single wire unshielded conductor 9 to a second rheostat comprising linear resistor 66, wiper 68 and manually-operable control knob 6. Again the control knob 6 is mechanically connected with wiper 68 to move the wiper across the linear resistor 66. The resistor 66 is connected across the voltage source $V_R$ to present a variable voltage to the drain electrode of transistor 54.

The entire combination of field effect transistor 54, capacitor 58 and resistors 60 and 62 functions as a common source variable gain amplifier and appears electrically in the receiver circuit as a variable filter between the audio transfer line 72 and ground. As the wiper 68 is moved toward the voltage source $V_R$, the drain voltage is increased, resulting in an increased gain in the amplifier comprising transistor 54. This increase in gain produces an increase in the capacitive effect of the combination of transistor 54 and capacitor 58. This increased capacitance tends to increase the high frequency filtering effect by providing a lower impedance shunt path to the high frequency signals transferred between the detector stage and the audio stage of the receiver.

In the specific embodiment described above, it can be seen that only positive DC voltages need be available to accomplish the variable volume and tone effects desired. Further, since only non-signal DC voltages are carried over conductors 7 and 9, the control portion 36 may be remotely located from the balance of the receiver, and the wires 46 and 64 need not be shielded to prevent signal interference. This feature also is of advantage in applying the invention to automotive environments.

It is to be understood that the foregoing description is illustrative in nature and is not to be construed as limiting the invention to the specific apparatus described. For definition of the invention, reference should be had to the appended claims.

I claim:

1. In combination, a radio receiver having a signal detector stage and an audio amplifier stage, volume control apparatus comprising rheostat means remote from the receiver for producing a selectively variable DC voltage representing desired volume, a variable gain amplifier connected between the detector and audio stages and including a field effect transistor having gate, source and drain electrodes, means coupling signals from the detector stage to the gate electrode, resistive means connected between the gate and source electrodes, means coupling the source electrode to the audio stage, and means connecting the variable DC voltage to the drain electrode to selectively vary the gain of the field effect transistor.

2. In combination, a radio receiver having a signal detector stage and an audio amplifier stage, tone selection apparatus comprising rheostat means for producing a selectively variable DC voltage representing desired tone selection, a field effect transistor having gate, source and drain electrodes, a capacitor connected between the gate and drain electrodes, resistive means connected between the gate and source electrodes, means coupling signals from the detector stage to the gate electrode, and fixed resistor means connecting the drain electrode to said variable DC voltage to selectively vary the gain of the field effect transistor.

3. In a radio receiver having a signal detector stage and an audo amplifier stage, volume and tone selector apparatus comprising: a source of positive DC voltage, first and second rheostats connected to the source to provide respective first and second selectively variable DC voltages representing desired volume and tone, a first variable gain amplifier connected between the detector and audio stages for volume control and including a first field effect transistor having gate, source and drain electrodes, means coupling signals from the detector stage to the gate electrode, resistive means connected between the gate and source electrodes, means coupling the source electrode to the audio stage, and means connecting the first variable DC voltage to the drain electrode to selectively vary the gain of the field effect transistor, and a second variable gain amplifier for tone control and including a second field effect transistor having gate, source and drain electrodes, a capacitor connected between the gate and drain electrodes, resistive means connected between the gate and source electrodes, means coupling signals from the detector stage to the gate electrode of the second transistor and fixed resistor means connecting the drain electrode to said second variable DC voltage to selectively vary the gain of the field effect transistor.

4. In combination: a radio receiver including a signal detector stage for providing an audio signal and an audio amplifier stage for amplifying the audio signal; control means separate and remote from the radio receiver for providing a DC control voltage at a selectively variable magnitude; a field effect transistor having gate, source and drain electrodes, the gate electrode connected with the signal detector stage and the source electrode connected with the audio amplifier stage for transferring the audio signal between the signal detector stage and the audio amplifier stage; and a single conductor connected between the control means and the drain electrode of the field effect transistor for applying the DC control voltage to the drain electrode to vary the gain of the field effect transistor in response to the magnitude of the DC control voltage so as to correspondingly vary the volume of the audio signal.

References Cited

UNITED STATES PATENTS

| | | | |
|---|---|---|---|
| 2,006,099 | 6/1935 | Farnham | 325—390 |
| 2,250,581 | 7/1941 | Heinecke | 325—390 |
| 2,930,000 | 3/1960 | Seler | 330—145 |
| 3,130,374 | 4/1964 | Beres et al. | 330—28 |
| 3,388,338 | 6/1968 | Austin | 330—29 |

OTHER REFERENCES

Electronics, Dec. 14, 1964, page 69.

ROBERT L. GRIFFIN, Primary Examiner

R. L. RICHARDSON, Assistant Examiner

U.S. Cl. X.R.

325—391, 424; 330—35